(12) United States Patent
Ku et al.

(10) Patent No.: US 8,143,789 B2
(45) Date of Patent: Mar. 27, 2012

(54) ILLUMINATION SYSTEM

(75) Inventors: Chin-Long Ku, Taipei Hsien (TW); Qing-Hai Ruan, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 427 days.

(21) Appl. No.: 12/463,344

(22) Filed: May 8, 2009

(65) Prior Publication Data

US 2010/0164384 A1    Jul. 1, 2010

(30) Foreign Application Priority Data

Dec. 27, 2008   (CN) .......................... 2008 1 0306570

(51) Int. Cl.
  *B60Q 1/02*   (2006.01)
(52) U.S. Cl. ............................. 315/82; 315/77; 315/360
(58) Field of Classification Search .................... 315/77, 315/82, 360
See application file for complete search history.

(56) References Cited

U.S. PATENT DOCUMENTS

| | | | | |
|---|---|---|---|---|
| 3,591,825 | A * | 7/1971 | Keighley, Jr. | 315/82 |
| 4,236,099 | A * | 11/1980 | Rosenblum | 315/83 |
| 5,483,107 | A * | 1/1996 | Xander | 307/10.8 |
| 6,153,975 | A * | 11/2000 | Perdec | 315/82 |
| 6,254,259 | B1 * | 7/2001 | Kobayashi | 362/465 |
| 6,293,686 | B1 * | 9/2001 | Hayami et al. | 362/465 |
| 6,518,704 | B1 * | 2/2003 | Schuler | 315/82 |
| 6,566,816 | B2 * | 5/2003 | Fushimi et al. | 315/82 |
| 6,611,610 | B1 * | 8/2003 | Stam et al. | 382/104 |
| 6,909,236 | B2 * | 6/2005 | Schmitt et al. | 315/82 |
| 7,456,590 | B2 * | 11/2008 | Takeda et al. | 315/360 |
| 7,619,511 | B2 * | 11/2009 | Kesterson | 340/468 |
| 2004/0218401 | A1 * | 11/2004 | Okubo et al. | 362/526 |
| 2005/0111231 | A1 * | 5/2005 | Crodian et al. | 362/545 |
| 2008/0122376 | A1 * | 5/2008 | Lys | 315/192 |
| 2008/0129206 | A1 * | 6/2008 | Stam et al. | 315/82 |

* cited by examiner

*Primary Examiner* — Jason M Crawford
(74) *Attorney, Agent, or Firm* — Altis Law Group, Inc.

(57) ABSTRACT

An illumination system includes an LED lamp, a timer, a controlling circuit, a driving circuit and a power source electrically connected together. The timer produces different signals to the controlling circuit at different periods, thereby driving the LED lamp to lighten with different brightness. A light or movement sensor is further electrically connected to the LED lamp to work together with the timer. The sensor cooperating with the timer, detects light or movement of an object to drive the LED lamp to lighten for a while with a corresponding brightness.

15 Claims, 19 Drawing Sheets ized as ceramic. Alternatively, for a low power LED die 120 which generates heat not

ILLUMINATION SYSTEM

BACKGROUND

1. Technical Field

The present disclosure relates to an illumination system and, more particularly, to an illumination system having a low energy consumption.

2. Description of Related Art

LEDs have been available since the early 1960's. Compared with the conventional light sources, such as fluorescent lamp, halogen lamp and incandescent lamp, the LEDs have a higher electro-optical conversion efficiency. Thus, nowadays LED usage has been increased in popularity in various applications, particularly, the applications needing large power consumption, in order to reduce operation cost of these applications.

A road lamp is one type of lamps consuming a larger amount of power; thus, it is extremely desirable to replace the typical light source of the road lamp with the LEDs. However, even employing the LEDs as the light source, the road lamp still has a large power consumption since a high luminous flux is required for ensuring sufficient luminosity on the road needing be illuminated by the lamp. Therefore, many attempts are tried to reduce the power consumption of the LED road lamp, such as increasing the electro-optical conversion efficiency of the LEDs, raising brightness of the LEDs, optimizing light pathway in the lamp, and improving electrical circuits connected to the lamp.

Nevertheless, these attempts are difficult to achieve significant effect due to the technologies thereof having been developed for a long time and reached respective bottlenecks. On the other hand, there is a phenomenon ignored in road illumination all the time, that is, the lamp always keeps a constant brightness all over the illumination period thereof, even in the late night where the traffic flow is relatively low. In fact, at the late night there is no need to provide such a high intensity as that at early night to illuminate the road just for few vehicles driving on the road. The lamp would waste a large amount of power to maintain the constant brightness thereof.

What is needed, therefore, is an illumination system which can overcome the above-mentioned disadvantages.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
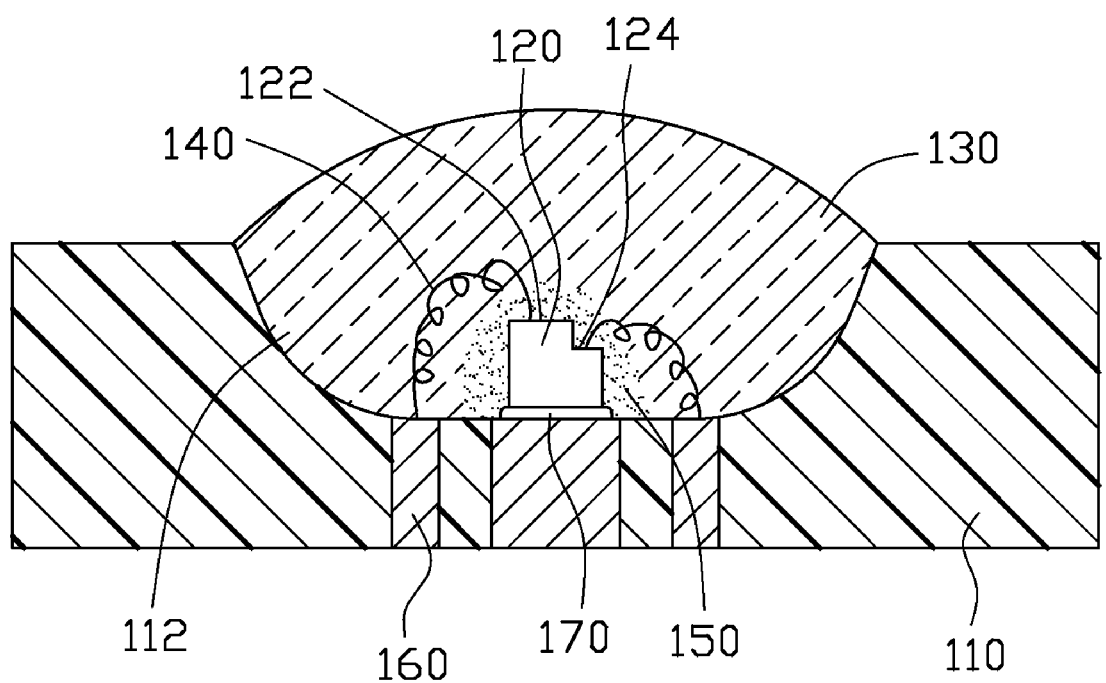
FIG. 1 is a cross-sectional view of an LED of a first embodiment of the present disclosure.

Referring to FIG. 1, an LED of a first embodiment of the present disclosure is disclosed. The LED includes a substrate 110, an LED die 20 bonded on the substrate 110, two golden wires 140 connecting the LED die 120 and an encapsulant 130 fixed on the substrate 110 and enclosing the LED die 120.

The substrate 110 is made from a heat conductive and electrically insulative material, such as ceramic. Alternatively, for a low power LED die 120 which generates heat not too much, the material of the substrate 110 can also be selected from some heat isolative and electrically insulative materials, such as epoxy. A central part of a top face of the substrate 110 is recessed downwardly to form a cavity 112. A bottom of the cavity 112 is configured to a flat surface so as to stably support the LED die 120 thereon. Two curved laterals of the substrate 110 confining the cavity 112 are plated with a reflective layer (not shown) thereby to reflect as much light emitted from lateral sides of the LED die 120 as possible. Three metal posts 160 are inserted into the substrate 110 below the bottom of the cavity 112, wherein two lateral posts 160 are configured having a same size, and a middle post 160 has a diameter larger than that of each lateral post 160. Tops of the three posts 160 are all coplanar with the bottom of the cavity 112 to be exposed within the cavity 112, thereby allowing the LED die 120 and the wires 140 bonded thereon, respectively. The two lateral posts 160 act as two electrical leads to supply power into the LED die 120, while the middle post 160 acts as a heat conductor to transfer the heat from the LED die 120 to an outside of the LED.

The LED die 120 is a semiconductor light emitting component made of well-known gallium nitride-based compound and capable of emitting blue light having a short wavelength near 450 nm. The LED die 120 has a P type electrode 122 and an N type electrode 124 stacked on a top thereof. The P type electrode 122 is located higher than the N type electrode 124. A bottom of the LED die 120 is bonded to the top of the middle post 160 via a heat conductive epoxy resin 170 containing silver particulates therein, whereby the heat generated by the LED die 120 can be conducted out of the LED through the middle post 160. Phosphor 150, in the form of particulates, is distributed around the LED die 120 within the encapsulant 130. The phosphor 150 is employed to emit light complemented with that emitted by the LED die 120, generating light with desirable color. A composition of the phosphor 150 determines which color of light the phosphor 150 can emit. For a general illumination purpose requiring white light, the phosphor 150 of this disclosure employs garnet fluorescent materials activated with cerium, preferably, yttrium-aluminum-garnet fluorescent with cerium (generally creating so-called YAG phosphor). It is noted that though the YAG is chosen as the material of the phosphor 150 of this embodiment, other type materials, such as silicate-based material may also be used. The phosphor 150 absorbs the blue light emitted from the LED die 120 and is excited to emit yellow light having a wavelength about 580 nm. The original blue light without contributing to the excitation of the phosphor 150, is blended with the yellow light excited by the phosphor 150 to output resultant white light.

The two golden wires 140 are provided in the cavity 112 to electrically connect the LED die 120 with the posts 160. Each wire 140 has an end bonded to an electrode 122, 124 of the LED die 120, and another end fixed to a corresponding lateral post 160, thereby forming an electricity conducting route between the LED die 120 and the posts 160. Each wire 140 is particularly configured to be spiral, so that the two wires 140 are presented as two small inductances between the LED die 120 and the substrate 110. It is well known that a most important characteristic of the inductance is to permit direct current flowing therethrough and resist alternate current passing therethrough. When an abruptly varied current which is produced following a sudden electrical connection of the LED with a power source (not shown), is introduced into the LED, the abruptly varied current would be resisted by the spiral wires 140 and become more smooth. Compared with the abruptly varied current, such smoothly varied current is less harmful to the LED die 120, whereby the LED die 120 can be protected properly. Furthermore, the spiral wire 140 is more stretchy than the conventional curved wire, whereby the spiral wire 140 is less likely to be ruptured even when subject to a large stress from the encapsulant 130 due to expansion or shrink of the encapsulant 130. Therefore, the LED incorporating the spiral wires 140 is able to work normally under a relatively severe environment.

The encapsulant 130 is made from light-permeable material such as glass, epoxy and silicon. The encapsulant 130 fills the cavity 112 in the substrate 110 to completely seal the LED die 120, the two wires 140 and the phosphor 150 therein, protecting them from contamination or damage. The encapsulant 130 is further protruded upwardly out of the cavity 112 to form a dome on the substrate 110, as a result functioning as a convex lens to collimate the diffused light from the LED die 120 into a spot light.

Figure 2:
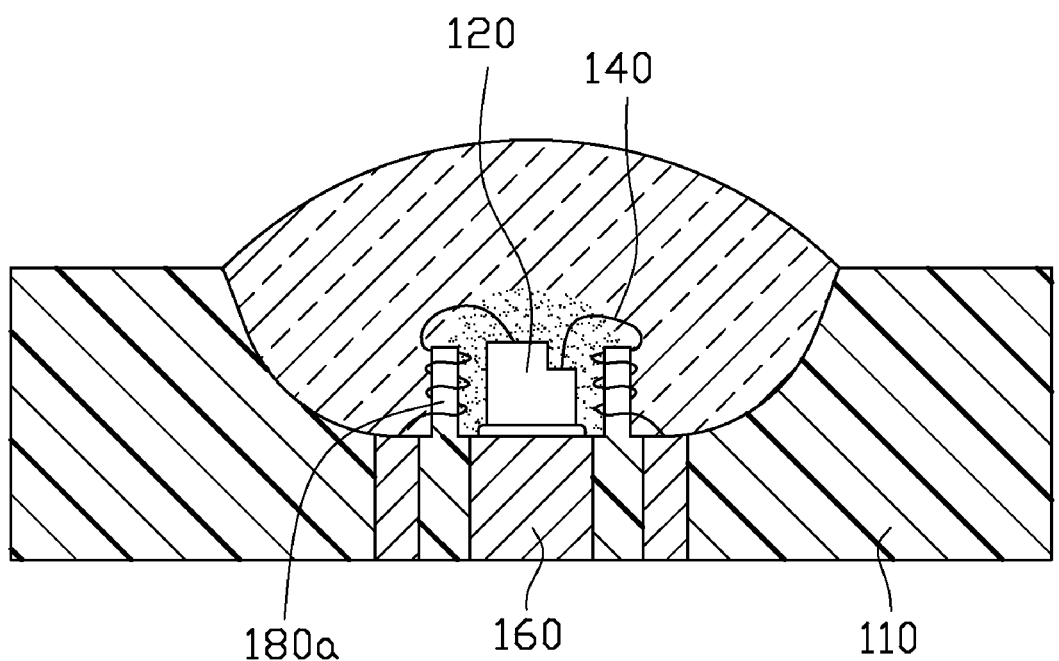
FIG. 2 is a cross-sectional view of an LED of a second embodiment of the present disclosure.

FIG. 2 depicts an LED similar to that shown in FIG. 1. The only difference between the LEDs of FIG. 1 and FIG. 2 is that the two wires 140 are wound around two columns 180a integrally protruding upwardly from the substrate 110, respectively. Each column 180a is located between the LED die 120 and a corresponding lateral post 160, whereby the top of the lateral post 160 can be substantially exposed for bonding of the wire 140 thereto. For a column wound by a metal wire, it is well known that the inductance of the wire is associated with a diameter of the column surrounded thereby, according to a formula given as $$L = \frac{\mu_0 \mu_r N^2 A}{l}, \text{ where:}$$

L presents the inductance of the wire, $\mu_0$ presents the permeability of vacuum, $\mu_r$ presents the relative permeability of the material of the column surrounded by the wire, N presents the number of winding turns of the wire, A presents the cross-sectional area of the column, and l presents the total length of the wire.

Since the inductance L is a direct quadratic ratio function of the diameter of the column 180a ($A=\pi*(D/2)^2$, where D presents the diameter of the column 180a surrounded by the wire 140), the inductance of the wire 140 can be varied by adjusting the diameter of the column 180a. In order to obtain a large inductance of the wire 140 for more smoothly varied current flowing therethrough, the column 180a can be made having a large diameter. Further, another applicable means of enhancing the inductance L is to increase the relative permeability of the column 180a, which can be realized by replacing the integrally formed columns 180a with two separately iron columns (not shown). The substrate 110 may form two recesses (not labeled) for insertion of the two iron columns therein. Note that due to the iron columns being electrically conductive, they can be combined with respective metal posts 160 to form two integral longer iron poles 160b (see FIG. 3) extending into the encapsulant 130. The spiral wire 140 can be coiled around an upper portion of the pole 160b and directly bonded to a circumferential surface of the pole 160b.

Figure 3:
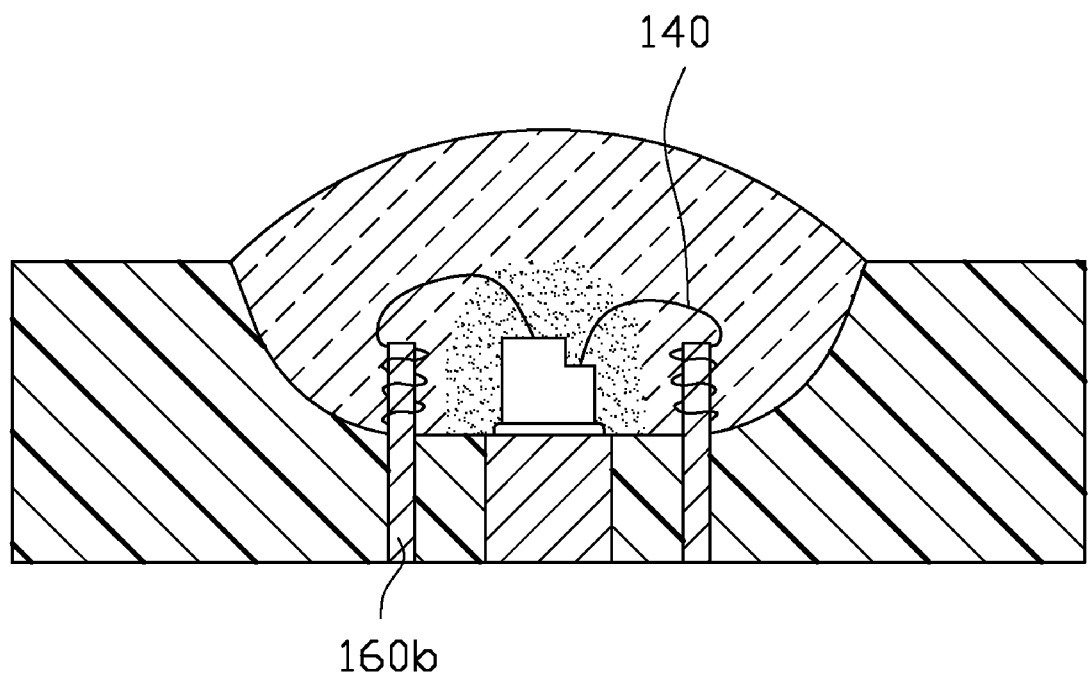
FIG. 3 is a cross-sectional view of an LED of a third embodiment of the present disclosure.

The LED die 120 shown in FIGS. 1-3 is named laterally-structured LED die, since the two electrodes 122, 124 are located at a same top side of the LED die 120. However, another type LED die called vertically-structured LED die (not shown) can also be used in this disclosure. The vertically-structured LED die has two electrodes respectively located at a bottom and a top thereof. For this vertically-structured LED die, only one wire 140 is needed since the electrode at the bottom of the LED die can be directly bonded to the central post 160. In this case, the middle post 160 not only acts as a heat conductor but also an electrical lead, while one of the two lateral posts 160 can be removed for saving cost.

The disclosure further discloses a method for manufacturing the LED shown in FIG. 2, including: 1) molding a substrate 110 with three metal posts 160 contained therein and two columns 180a projecting upwardly therefrom; 2) bonding ends of two wires 140 on two lateral posts 160; 3) winding the wires 140 around corresponding columns 180a; 4) bonding an LED die 120 on a middle post 160 via a heat conductive epoxy resin 170; 5) bonding other ends of the two wires 140 on two electrodes 122, 124 of the LED die 120; 6) coating a phosphor 150 around the LED die 120; and 7) injecting a transparent material on the substrate 110 to form an encapsulant 130. Alternatively, the LED shown in FIG. 3 can also be manufactured following the previous steps; however, a little change should be implemented in the steps 1)-4), that is, the two columns 180a and the two lateral posts 160 are replaced by the two poles 160b.

This disclosure also provides a multichip LED capable of emitting light with different color temperatures. It is well known that the color temperature of light which is usually measured in Kelvin (k), is a value associated with people's subjective feeling about how warm or cold the light seems like, rather than a real temperature of the light. In fact, it has been proved that the light used for general illumination nearly does not contain any heat. For an orange light or an orange-white light, people would feel warm though nearly no heat is included in the light. For a blue light or a blue-white light, people would feel cold, even though no heat is taken away from people by the light. In the related art, an acknowledged warm color has a value ranging below 3300 k, while an acknowledged cold color has a value ranging above 5300 k.

Figure 4:
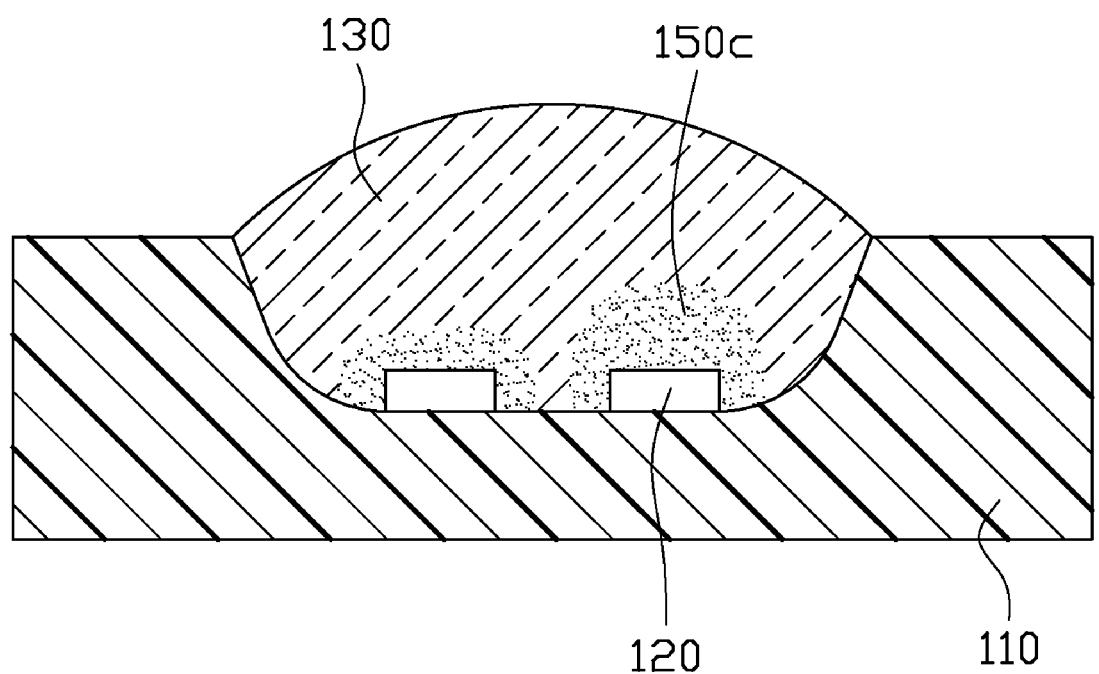
FIG. 4 is a cross-sectional view of an LED of a forth embodiment of the present disclosure, wherein only LED dies, phosphors, an encapsulant and a substrate of the LED are present for clarity.

For the LED employing the blue chip and the yellow phosphor to emit resultant white light, the number of the phosphor particulates in the encapsulant determines which color temperature the resultant white light can have, without changing the LED die. That is to say, different amount of phosphor particulates cooperation with a same LED die would result in different light with respective color temperatures. Referring to FIG. 4, there are two same LED dies 120c provided with two different phosphors 150c. The two phosphors 150c are distributed in the encapsulant 130 with identical densities and different thicknesses. A left LED die 120 cooperating with its thin phosphor 150c emanates colder light, since the thin phosphor 150c can only absorb little blue light emitted from the LED die 120 and be activated to emit little yellow light, which is blended with remaining much blue light to produce white light shifting toward blue (white-blue light). While a right LED die 120 cooperating with its thick phosphor 150c emanates warmer light, since the thick phosphor 150c can generate a large amount of yellow light. It is noted that only necessary elements i.e., the substrate 110, the encapsulant 130, the two LED dies 120 and the phosphors 150c, are shown in FIG. 4, while other elements are all omitted for clarity.

Figure 5:
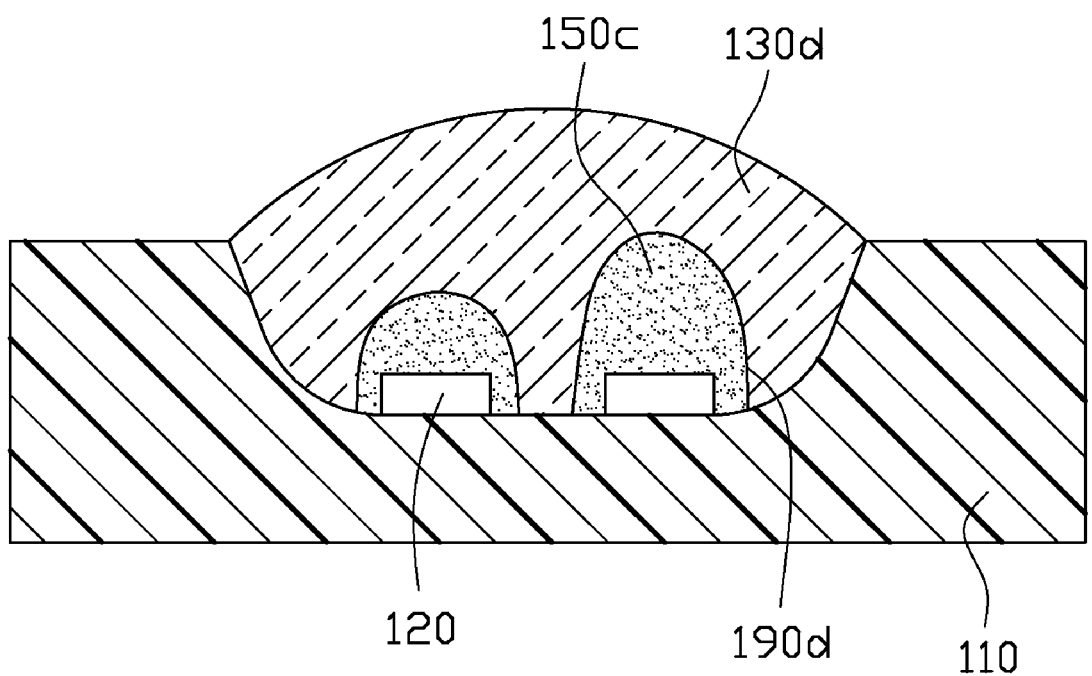
FIG. 5 is similar to FIG. 4, showing an LED of a fifth embodiment of the present disclosure.

Such direct coating of the phosphor 150c on the LED die 120 may cause an uneven distribution of the phosphor 150c around the LED die 120, since it is difficult to accurately apply the phosphor 150c on such a small LED die 120, which often has a size less than 40 mil*40 mil*10 mil. Therefore, a variation should be made to the LED for resolving the problem. As shown in FIG. 5, the two LED dies 120 and respective phosphors 150c are enveloped by two first encapsulants 190d, which are further enveloped by a second encapsulant 130d. A left first encapsulant 190d has a size less than that of a right first encapsulant 190d, whereby the phosphors 150c contained within the two first encapsulant 190d in same density would have different amounts. The first encapsulant 190d is molded on the substrate 110 prior to the second encapsulant 130d so that the phosphor 150c can be evenly doped in the first encapsulant 190d when the first encapsulant 190d was still in melted condition and not molded on the substrate 110. The second encapsulant 130d is made from a light-permeable material equal to that of the first encapsulant 190d, but without any phosphor 150c contained therein. Also, the material of the second encapsulant 130d can be different from that of the first encapsulant 190d for a better light collimation, preferably, the second encapsulant 130d could have a refractive index less than that of the first encapsulant 190d. Being doped within the first encapsulants 190d, the phosphors 150c can be uniformly distributed around the LED dies 120, and the blue light and the yellow light is thus mixed more evenly.

Figure 6:
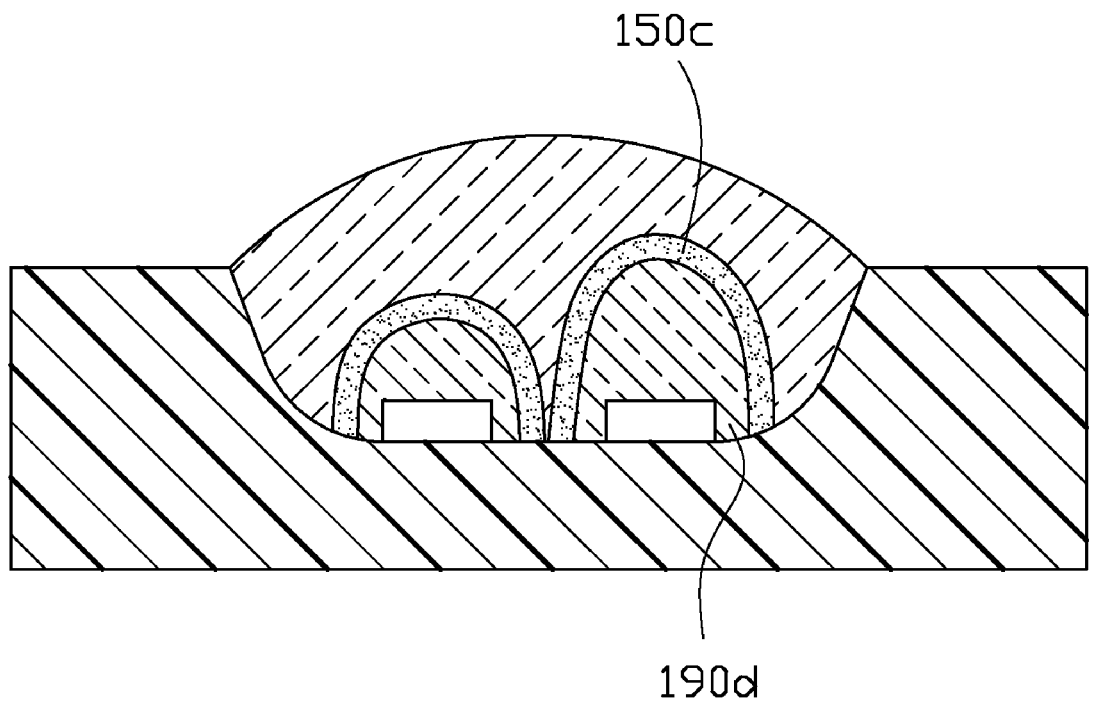
FIG. 6 is similar to FIG. 5, showing an LED of a sixth embodiment of the present disclosure.

Alternatively, the phosphors 150c can also be coated on outer surfaces of the two first encapsulants 190d after the first encapsulants 190d has been cured and molded on the substrate 110 but before the second encapsulant 130d is molded on the substrate 110. The large size of the first encapsulant 190d can insure an even distribution of the phosphor 150c on the outer surface thereof. As shown in FIG. 6, the difference between the sizes of the two first encapsulants 190d determines that the phosphors 150c attached on the outer surfaces of the two first encapsulants 190d still have different numbers of particulates even in the case of same density and same thickness of the phosphors 150c.

Figure 7:
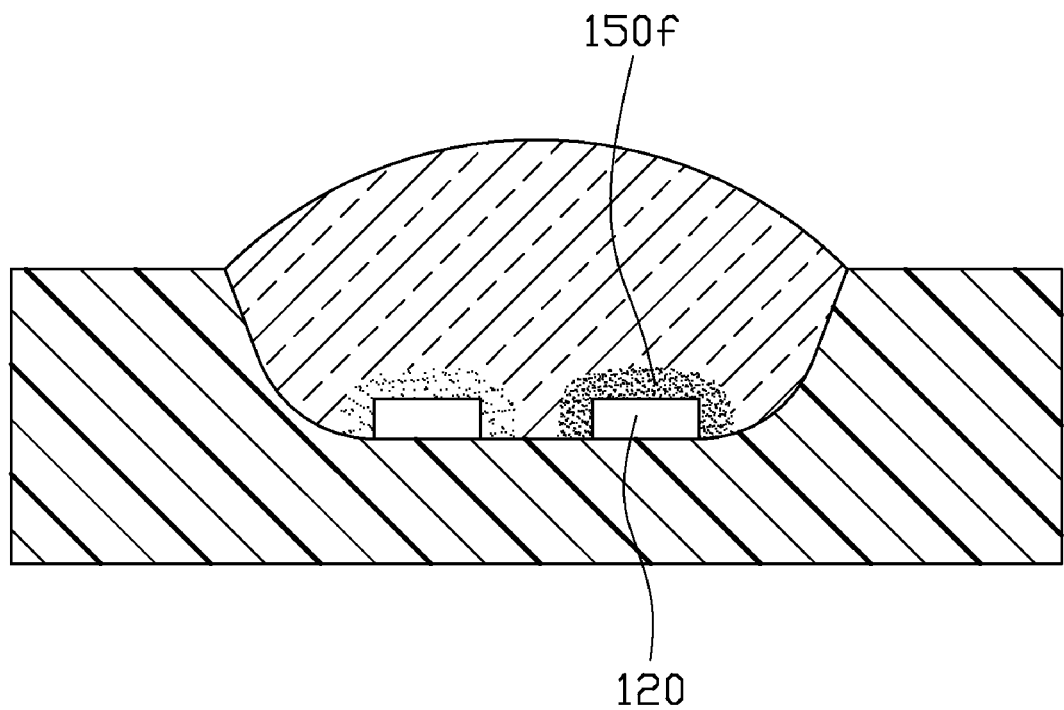
FIG. 7 is similar to FIG. 4, showing an LED of a seventh embodiment of the present invention.

Further, the phosphors 150c can be coated on the two LED dies 120 with different densities but identical thickness, ensuring a difference between the amounts of phosphor particulates surrounding the two LED dies 120. As shown in FIG. 7, the right LED die 120 is adhered with a phosphor 150f more denser than that on the left LED die 120. Alternatively, similar to that shown in FIG. 6, the two phosphors 150f having the same thickness but different densities can be applied on outer surfaces of two different-sized first encapsulants 190d, and further sealed by a larger second encapsulant 130d.

The two LED dies 120 of each LED illustrated in FIGS. 4-7 are controlled by respectively independent electrical circuits, wherein only one of the two LED dies 120 in each LED is selected to lighten each time, thereby generating white light with a desired color temperature. Therefore, each LED illustrated in FIGS. 4-7 can generate two lights with different color temperatures at different times, respectively, to thereby meet a user's requirement. Furthermore, since the LED dies illustrated in FIGS. 4-7 are only desired to be switched between an "on" and "off" states, not too complicated controlling element, such as a process, is necessary for realizing such switch between the two states. In fact, just a simple controlling circuit connected to the LEDs could have such function. Therefore, in contrast to the conventional RGB multichip LED, an LED lamp using the LEDs shown in FIGS. 4-7 can have a lower cost.

The LEDs shown in FIGS. 4-7 can have adjustable color temperature by including two LED dies 120 in a single LED; however, due to relatively complication in manufacturing the multichip LED, it is still costly for manufacturing a single multichip LED than two conventional single-chip LEDs. Therefore, for an LED lamp requiring a low total cost as well as adjustable color temperature, a plurality of conventional single-chip LEDs which each have a predetermined color temperature, can be applied.

Figure 8:
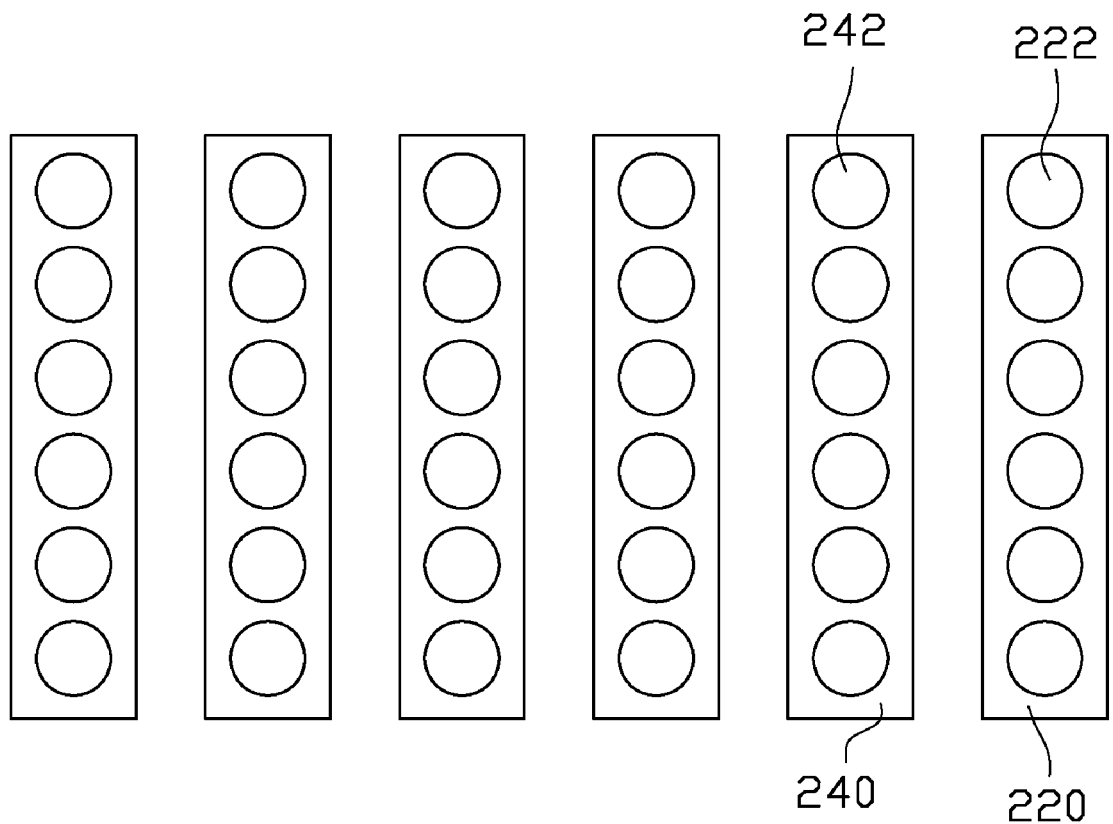
FIG. 8 is a schematic, bottom view of an LED array of an LED lamp of the present disclosure.

FIG. 8 shows an arrangement of six LED modules 220, 240 mounted within a lamp enclosure (not shown) from a bottom aspect. Three first LED modules 220 and three second LED modules 240 are alternately arranged in the lamp enclosure, wherein each first LED module 220 includes a plurality of first LEDs 222 generating warm light, and each second LED modules 240 includes a plurality of second LEDs 242 generating cold light. The three first LED modules 220 are electrically connected in series, and so do the three second LED modules 240. The first LED modules 220 are further electrically connected to the second LED modules 240 in parallel relation so that the first LED modules 220 and the second LED modules 240 are independently controlled. The LED lamp, which incorporates two different types of LED modules 220, 240 therein and has only one type of LED module 220 (240) lightening at each time, can satisfy a specific illumination requirement. For example, in winter when people wants to get warm, the LED lamp can be switched to just lighten the first LED modules 220; while in summer when people wants cool, the LED lamp can be switched to just lighten the second LED modules 240. It is noted that the LED modules 220, 240 shown in FIG. 8 are all located in a common level; alternatively, the LED modules 220, 240 can also be located at different levels for obtaining various illumination patterns.

Figure 9:
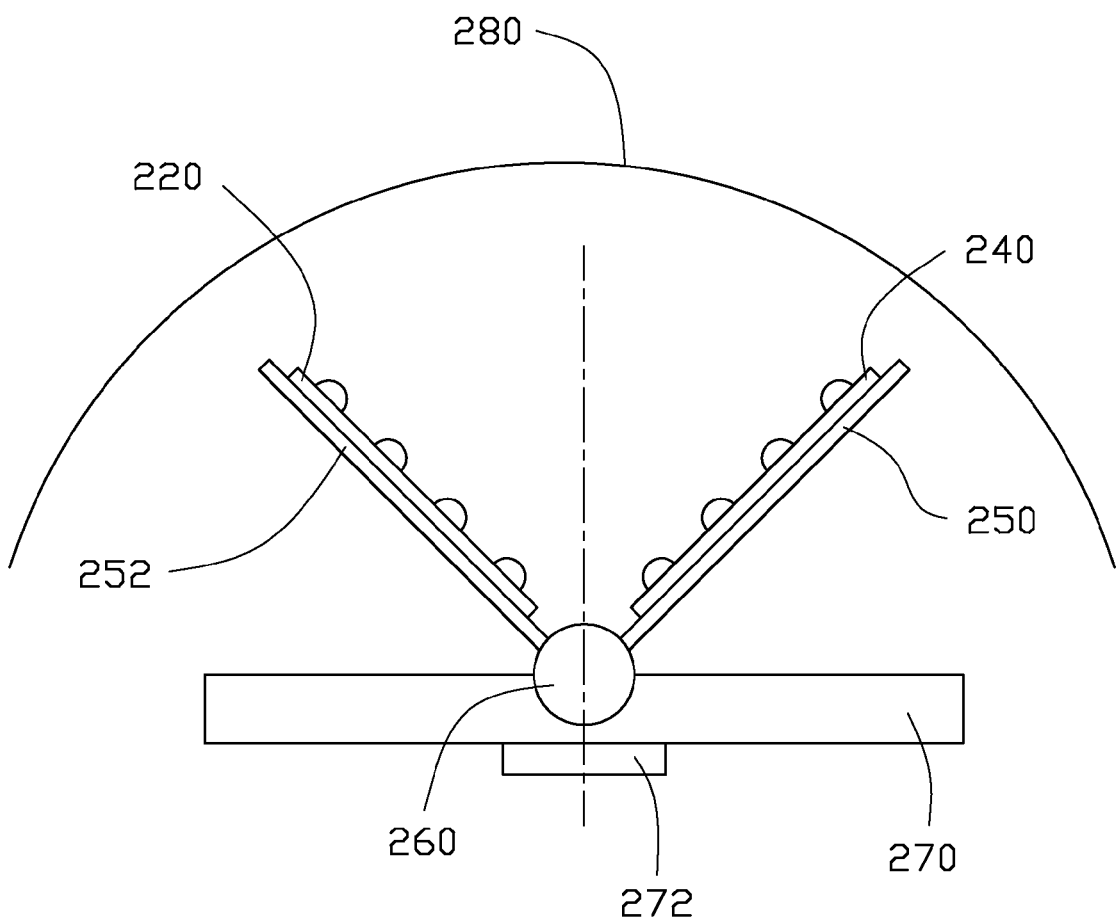
FIG. 9 is a schematic, cross-sectional view of another LED lamp of the present disclosure.

FIG. 9 illustrates another LED lamp using the LED modules 220, 240 of FIG. 8. Different from the alternate arrangement of the LED modules 220, 240 shown in FIG. 8, the first LED modules 220 are all mounted at a left side and the second LED modules 240 are all mounted at a right side. The LED lamp further comprises an L-shaped bracket 250 to mount the first LED modules 220 and the second LED modules 240 on two mutually perpendicular arms 252 thereof. A knob 260 is provided at a joint of the two arms 252 of the bracket 250 and a center of a base 270 spaced from the bracket 250. The knob 260 pivotably interconnects the bracket 250 and the base 270. In order to switch the LED lamp between a warm light status and a cold light status, a button 272 is attached on a bottom of the base 270 and in electrical connection with the first LED modules 220 and the second LED modules 240. A reflector 280 is fixed above and spaced from the bracket 250 for directing the light emitted from the LED modules 220, 240 downwardly. In operation, the first LED modules 220 and the second LED modules 240 can be selectively powered by the manipulating button 272, thereby generating white lights with desirable color temperatures at different times. Further, the LED modules 220, 240 can be pivoted around the center of the base 270 by rotating the knob 260, thereby collimating a light beam which is reflected by the reflector 280 from the LED modules 220, 240 in a predetermined orientation. Therefore, this LED lamp is able to simultaneously meet two type illumination requirements, i.e., direction and color temperature.

Figure 10:
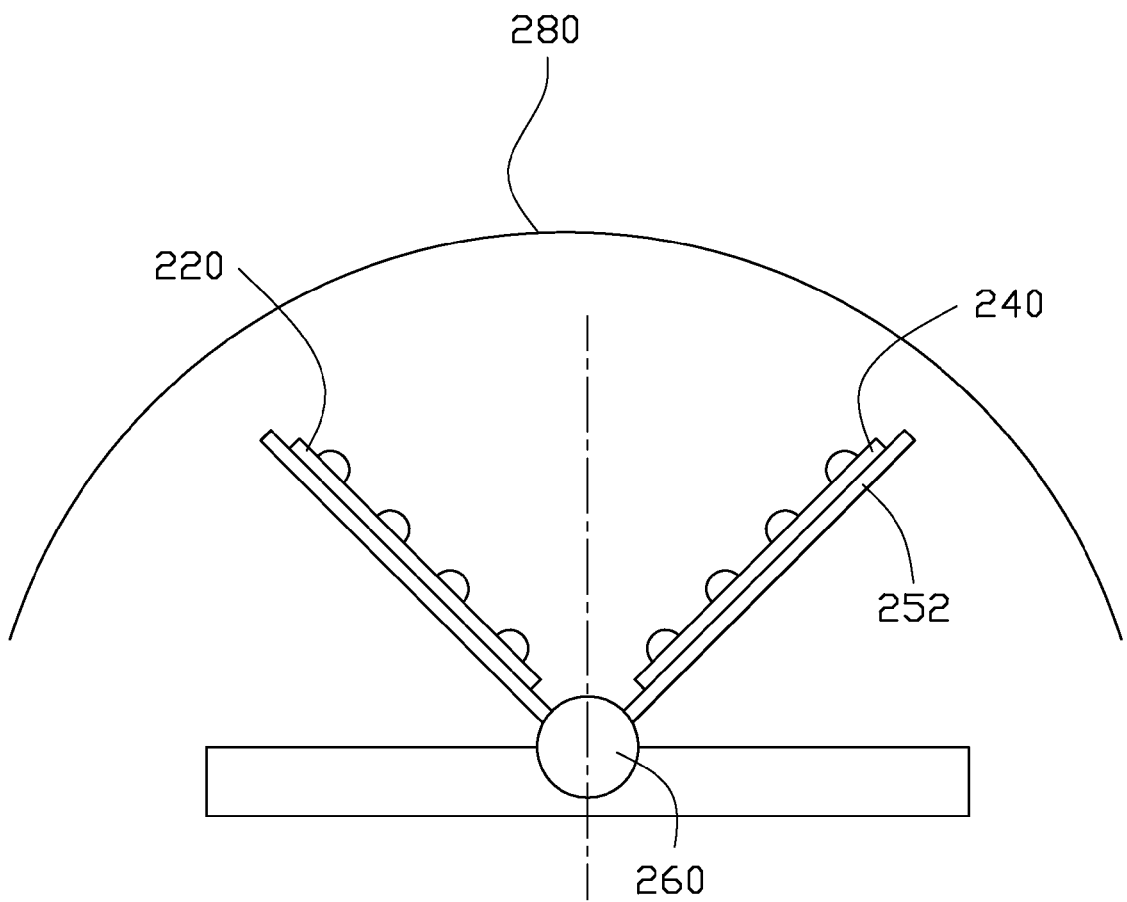
FIG. 10 is similar to FIG. 9, but a button of the LED lamp being removed.

In addition, the LED lamp of FIG. 9 can be further designed to another configuration for having an automatically color temperature switched function. Referring to FIG. 10, the LED lamp shown therein is similar to that shown in FIG. 9; what difference between FIG. 9 and FIG. 10 is that the button 272 is removed to be integrated with the knob 260. For this LED lamp of FIG. 10, the color temperature is automatically variable following variation of the orientation of the output light. For determining a switching moment of the LED lamp between the warm light status and the cold light status according to rotation of the output light, a critical angle is introduced. The critical angle is so employed that at the time when the critical angle is reached, the operation states of the first LED modules 220 and the second LED modules 240 will be reversed. The critical angle is a special value selected from an angle θ between the right arm 252 of the bracket 250 and an optical axis (the imaginary line shown in FIG. 10) of the reflector 280. Preferably, the critical angle has a value of 45°, whereby the first LED modules 220 and the second LED modules 240 are able to be controlled symmetrically. As rotation of the knob 260 to vary the angle θ between 0°~45°, only the first LED modules 220 are turned on so that the LED lamp produces the warm light; while the knob 260 is further pivoted to vary the angle θ over 45°, the first LED modules 220 are turned off and only the second LED modules 240 are turned on so that the LED lamp produces the cold light.

Figure 11:
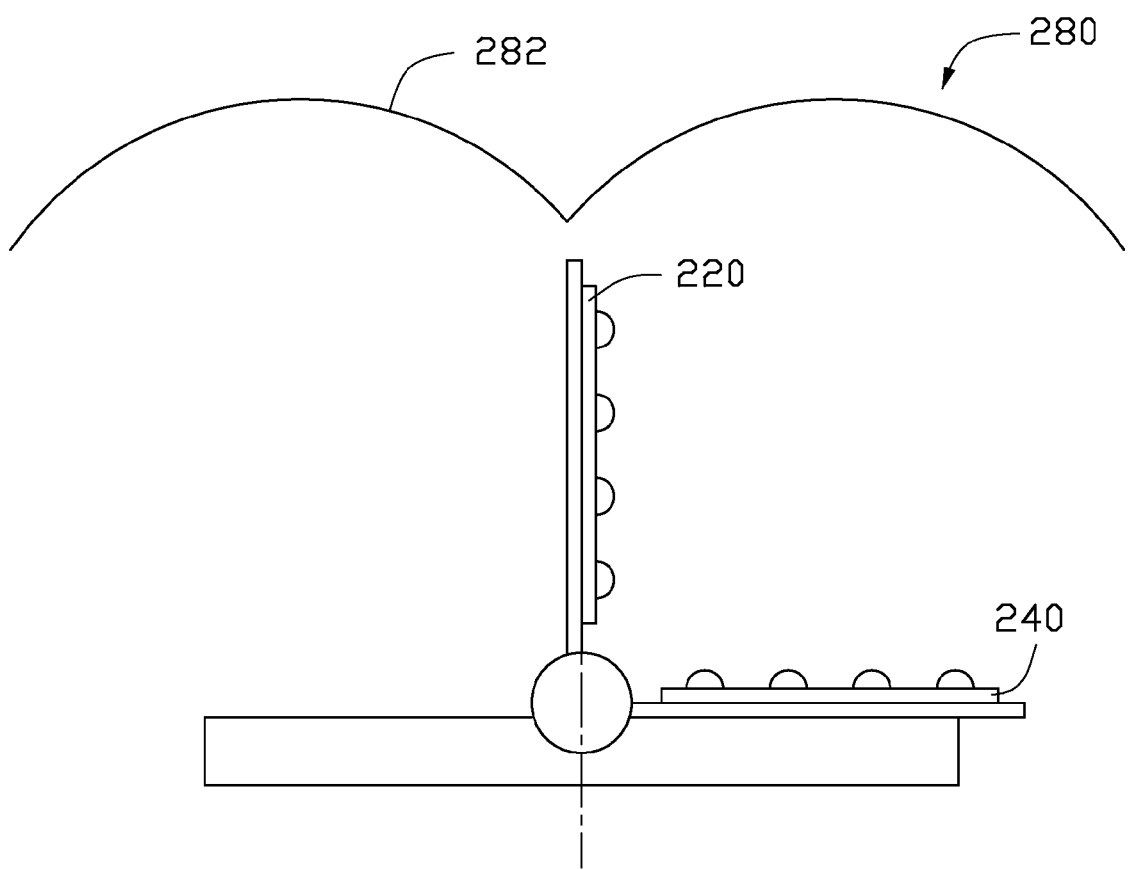
FIG. 11 is similar to FIG. 10, but a reflector of the LED lamp being varied to another configuration.

Also, the critical angle can be chosen with other values, or more critical angles can be defined, for meeting other various illumination requirements. FIG. 11 shows an LED lamp which has two critical angles. The LED modules 220, 240 of the LED lamp are powered only at the time when the two critical angles are achieved; in detail, the first LED modules 220 are lighten only the angle θ being positioned at 0°, and the second LED modules 240 are lighten only the angle θ being positioned at 90°. The reflector 280 of the LED lamp is particularly configured having two juxtaposed sub-reflectors 282. Each sub-reflector 282 has a concave reflective surface facing corresponding LED modules 220, 240, thereby reflecting as much light out of the LED lamp as possible when the LED modules 220, 240 are lighten at horizontal orientations.

Figure 12:
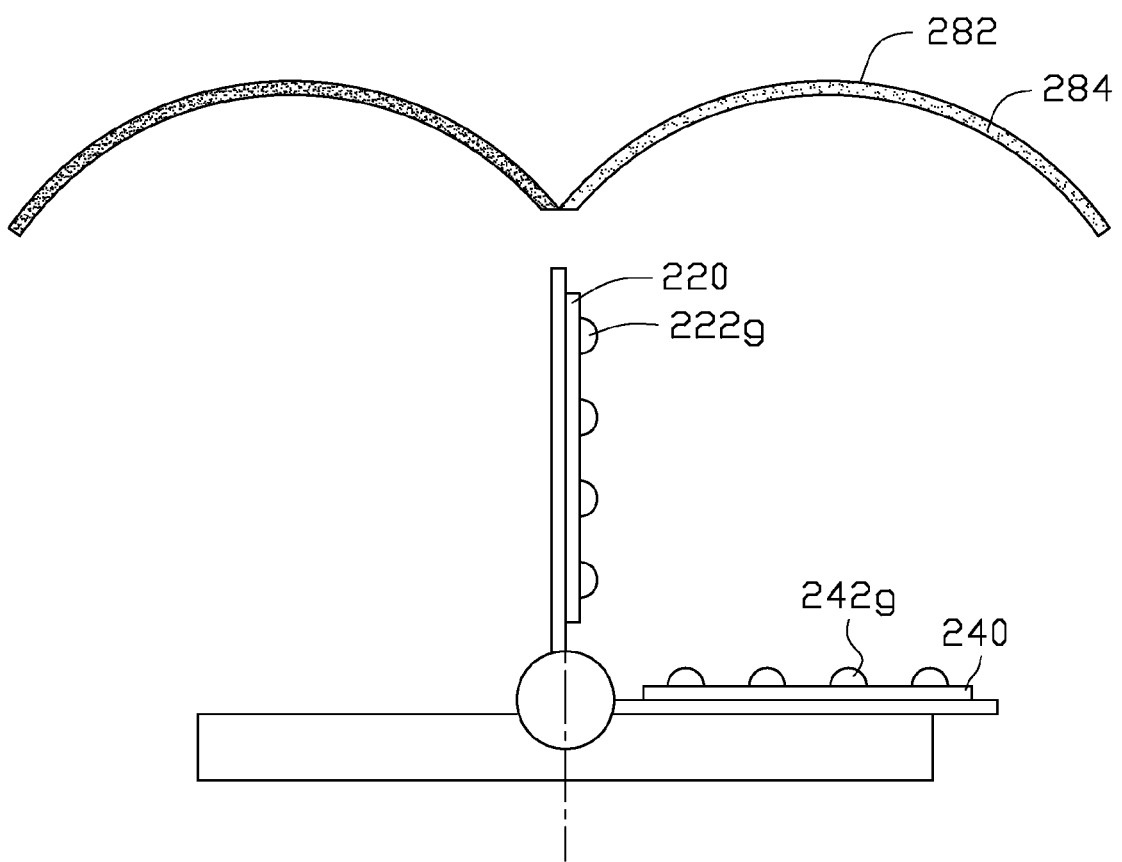
FIG. 12 is similar to FIG. 11, but two phosphor layers being coated on the reflector of the LED lamp.

Moreover, the LED lamp shown in FIG. 11 can be varied to a different configuration as shown in FIG. 12, with the same functionality thereof being performable. The LEDs 222g, 242g of the LED modules 220, 240 are typical blue LEDs which emit light in blue spectrum, while the two sub-reflectors 282 each forming a phosphor layer 284 correspond to the LED modules 220, 240. The amounts of phosphors 284 in the sub-reflectors 282 are different from each other, whereby the blue light emitted from the LED modules 220, 240 would be converted to white light with different color temperatures after the blue light stimulates the phosphors 284 to generate yellow light and mixes with the yellow light. Such separation of the phosphors 284 from the LED 222g, 242g can provide more flexibility in adjustment of the color temperature, since the phosphor 284 directly coated on the sub-reflector 282 is more accessible compared with that sealed in the encapsulant 130.

Note that the typical LEDs 222, 222g, 242, 242g used in FIGS. 8-12 can also be replaced by the LEDs shown in FIGS. 4-7 for more flexible illumination, although the total cost of the LED lamp may increase. Further, top surfaces of the LED modules 220, 240 except the LEDs 222, 222g, 242, 242g, can be coated with a reflective film (not shown) so that the light incident on the top surfaces of the LED modules 220, 240 from the reflector 280 can be reflected to the reflector 280 once more, increasing a light-outputting efficiency of the LED lamp.

Figure 13:
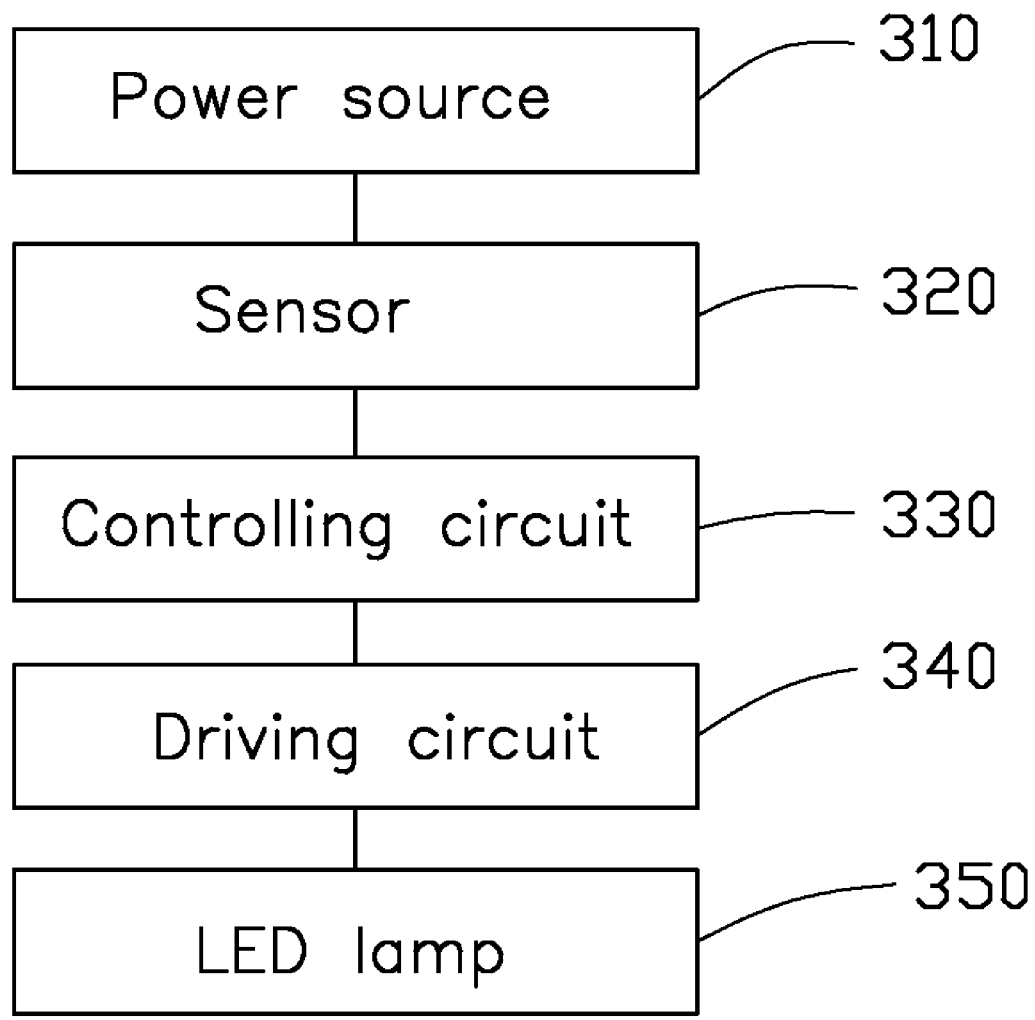
FIG. 13 is a block diagram of an LED power supply circuit connected to the LED lamp.

On the other hand, for an outdoor LED lamp, a fully automatic control is more desirable than the manual control described previously; to achieve this, a sensor may be electrically connected to the LED lamp to automatically switch the LED lamp between the warm light status and the cold light status. Referring to FIG. 13, the sensor 320 is provided between a power source 310 and a controlling circuit 330 connected to a driving circuit 340, thereby cooperatively forming a power supply circuit (not labeled) for the LED lamp 350. Although the sensor 320 shown in FIG. 13 is connected between the power source 310 and the controlling circuit 330, any other locations in the power supply circuit is applicable for the sensor 320. The sensor 320 can measure an environment parameter outside the LED lamp 350 and then produce a corresponding signal into the controlling circuit 330. In response to the signal, the controlling circuit 330 switches corresponding ones of the first LED modules 220 and the second LED modules 240 of the LED lamp 350 on or off via the driving circuit 340, thereby to output desired color temperature. The sensor 320 may be selected from different kinds of typical sensors; however, a temperature sensor or humidity sensor is preferable in this disclosure. If the temperature sensor 320 is used, the color temperature of the light of the LED lamp 350 is variable according to the outside environment temperature. For example, when the temperature sensor 320 measures the outside temperature below 15, it will produce a signal into the controlling circuit 330 to lighten the first LED modules 220 with warm light; when the temperature sensor 320 measures the outside temperature equal to or above 15, another signal will be given to the controlling circuit 330 to lighten the second LED modules 240 with cold light.

Also, the humidity sensor 320 connected to the LED lamp 350 can vary the color temperature of the LED lamp 350 in response to the humidity of the outside environment. It is well known that a long-wavelength light has a penetration ability better than that of the short-wavelength light, in other words, an orange-shifted light can spread a distance longer than that a blue-shifted light can spread. For a good visibility, a warmer light is much preferred in a rainy or fogged day due to a significant reduction of effect of water drops or particulates acting on the spread light. Therefore, the LED modules 220, 240 of the LED lamp 350 are in addition selected to lighten in accordance with the humidity of the outside environment, i.e., the first LED modules 220 are powered to produce the warm light as the sensor 320 detecting fog or water, while the second LED modules 240 are powered to produce the cold light in other weather conditions.

For resolving a problem that the two type sensors 320 cannot be simultaneously used due to interference of the signals thereof, the controlling circuit 330 can be particularly devised to judge the two signals from the two sensors 320 and select a corresponding signal to energize the LED lamp 350. A result of operation status of the LED lamp 350 under such particularly devised controlling circuit 330 is listed as:

| Temperature | Weather | The first LED modules | The second LED modules |
|---|---|---|---|
| >15 | fog or rain | on | off |
|  | Other | off | on |
| <15 | fog or rain | on | off |
|  | Other | on | off |

Figure 14:
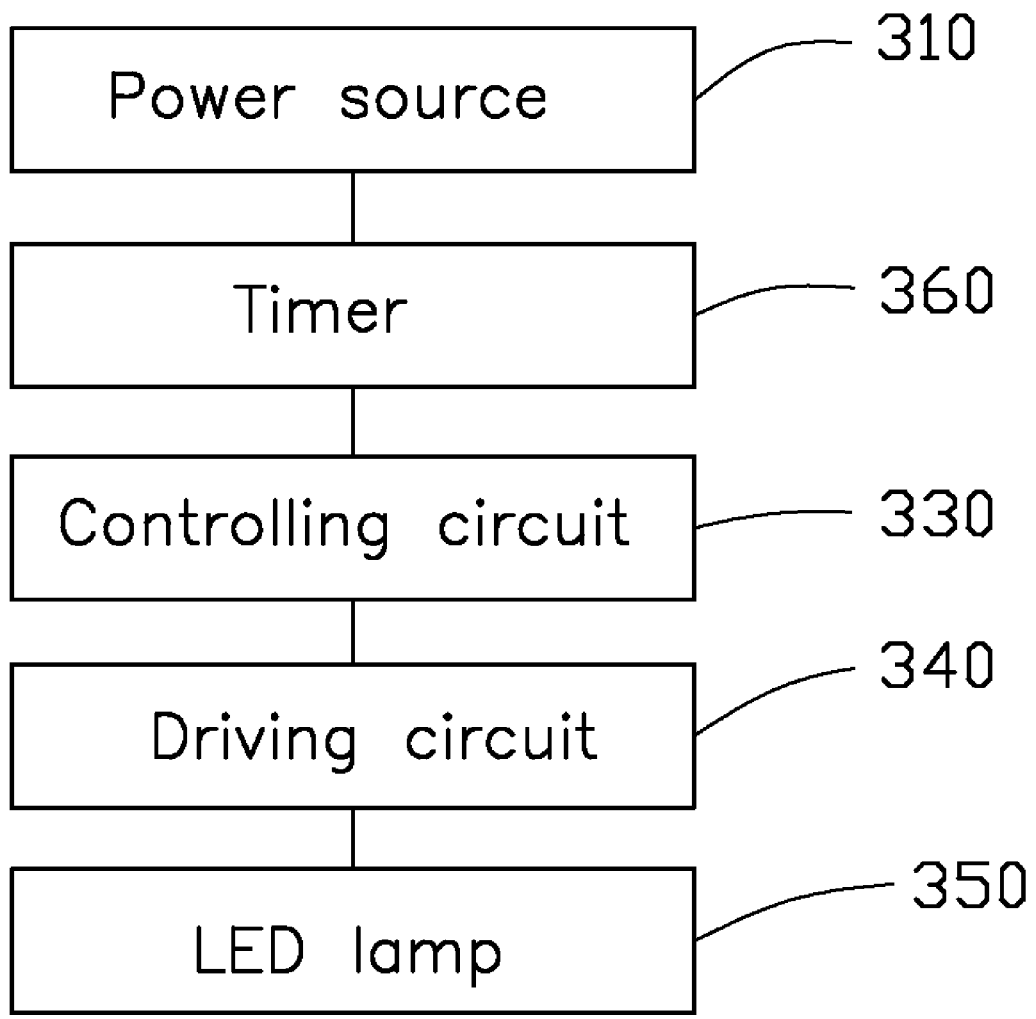
FIG. 14 is similar to FIG. 13, but a sensor of the power supply circuit being replaced with a timer.
Figure 15:
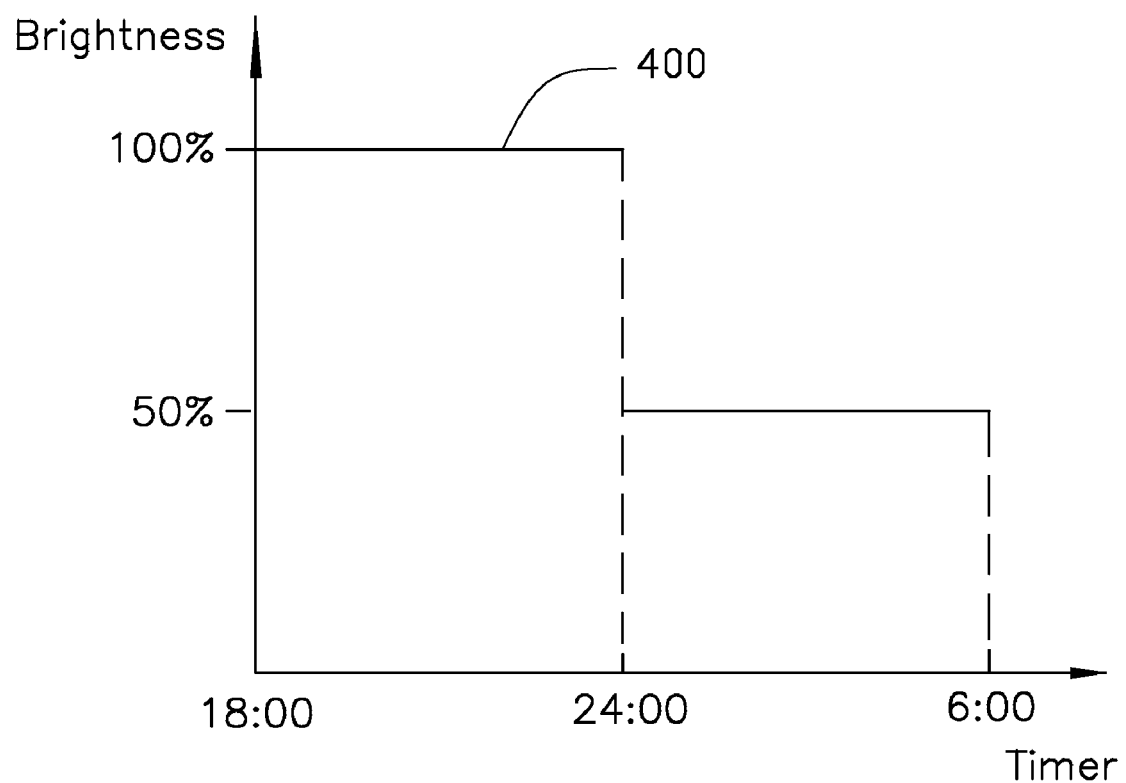
FIG. 15 is a brightness-time curve of the LED lamp controlled by the power supply circuit of FIG. 14.
Figure 16:
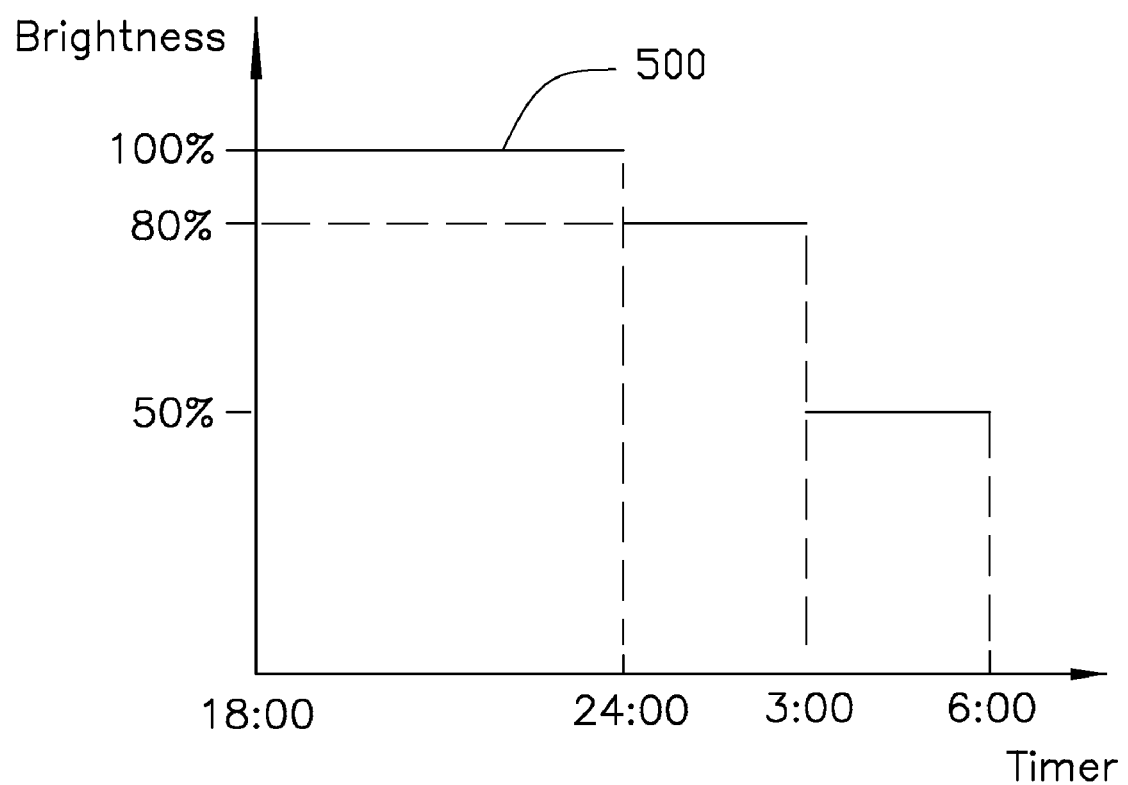
FIG. 16 is another time-brightness curve of the LED lamp controlled by the power supply circuit of FIG. 14.

Besides being switchable between the warm light status and cold light status, the LED lamp 350 is further designed automatically variable in brightness thereof for saving energy. As shown in FIG. 14, this is realized by connection of a timer 360 to the controlling circuit 330. The timer 360 is set to produce different continuous signals into the controlling circuit 330 at different times, thereby adjusting the brightness of the LED lamp 350 in different periods per day. An example of a brightness-time curve of the LED lamp 350 is shown in FIG. 15: between 18:00~24:00 when an amount of a traffic flow is high, the timer 360 continuously produces a signal I to energize the LED lamp 350 with 100% brightness; between 0:00~6:00 when the amount of the traffic flow is low, the brightness decreases to a half thereof according to a signal II produced by the timer 360; while between 6:00~18:00 when the sunshine being presented, the whole LED lamp 350 is turned off under a signal III of the timer 360. Such brightness-time curve 400 can satisfy the illumination demands of a subordinate street or road; however, for a main road or street where a traffic flow is still high even at late night, some changes should be made to the brightness-time curve 400. As referring to the brightness-time curve 500 shown in FIG. 16, a transition brightness having a ratio of 80% is added following the 100% brightness of the LED lamp 350. The timer 360 produces a signal IV to the controlling circuit 330 to lessen the brightness of the LED lamp 350 to the 80% brightness during 0:00~3:00 when the traffic is still busy, and then the signal II to further lessen the brightness of the LED lamp 350 to the 50% brightness during 3:00~6:00.

A light sensor (not shown) can be further connected to the controlling circuit 330 for achieving an even greater energy saving; that is, when the light sensor detects the light projected from the headlight of a vehicle (not shown) which is about to pass the LED lamp 350, the light sensor will produce an instantaneous signal to the controlling circuit 330 to turn the LED lamp 350 on temporarily; while at other times the LED lamp 350 remains off. In this case, the signals of the timer 360 works together with the signals of the light sensor: the signals of the timer 360 are accepted by the controlling circuit 330 only for a predetermined period (for example, 10 seconds) as soon as the instantaneous signal of the light sensor is input to the controlling circuit 330, whereby the LED lamp 350 would be energized to lighten the road for the predetermined period; at other times when no signal is produced by the light sensor, the signals of the timer 360 are rejected by the controlling circuit 330 for keeping the LED lamp 350 off. However, the acceptability of the signal III of the timer 360 is not affected by the signal of the light sensor so that in the daytime the LED lamp 350 can always be kept off. In other words, the signal III of the timer 360 is always accepted by the controlling circuit 330. In the time periods of signals I, II and IV, the signal of the light sensor precedes the signal of the timer 360, while in the time period of signal III, the signal of the timer 360 precedes the signal of the light sensor. The acceptability of the signals of the timer 360 by the controlling circuit 330 in connection with the signal of the light sensor is listed as:

| Signals of the timer | Whether a signal is produced by the sensor | Whether signal of the timer is accepted by the controlling circuit |
|---|---|---|
| I | Yes | Accepted |
|  | No | Rejected |
| II | Yes | Accepted |
|  | No | Rejected |
| III | Yes | Accepted |
|  | No | Accepted |
| IV | Yes | Accepted |
|  | No | Rejected |

The period of the signals I, II, IV of the timer 360 accepted by the controlling circuit 330 depends on a speed of the vehicle passing through the LED lamp 350; however, a period of 10 seconds is preferable in this disclosure for providing enough time to the vehicle. For preventing an interference of the light from the LED lamp 350 from directly illuminating the light sensor, a shield (not shown) should be mounted around the light sensor to allow it to receive the light from the vehicle only. Further, such light sensor can be replaced with a movement sensor, which outputs signals when detecting an object moving under the LED lamp 350. Moreover, every three adjacent LED lamps 350 can have just a single sensor mounted on a corresponding LED lamp 350 so that the three LED lamps 350 would be simultaneously controlled by the single sensor. Alternatively, the number of the LED lamps 350 controlled by the single sensor can be changed to four, five or more, depending on a distance between every two neighboring LED lamps 350 and a height of each LED lamp 350.

The LED lamp 350 used outdoors is automatically controllable for labor-saving; nevertheless, the LED lamp used in residential environment can be manually controllable for more flexibility. The typical residential LED lamp often has a multiplex switch connected therewith to adjust its brightness with a plurality of different levels. The multiplex switch includes multiple positions to be switched, wherein each position corresponds to a brightness level of the LED lamp. The brightness of the LED lamp can be conveniently switched between different levels by manipulating the multiplex switch at different positions; for example, when the switch is switched to a first position, a first electrical pathway would be connected to lighten the LED lamp with 100% brightness, while the switch is switched to a second position, a second electrical pathway would be connected to lighten the LED lamp with 80% brightness, and etc. However, the multiple positions of the multiplex switch require many electrical pathways connected thereto, resulting in electrical routes of the multiplex switch relatively complicated. Therefore, for simplifying the electrical circuits of the switch capable of adjusting the brightness of the LED lamp, a new type switch and its power supply circuit are further provided herein.

Figure 17:
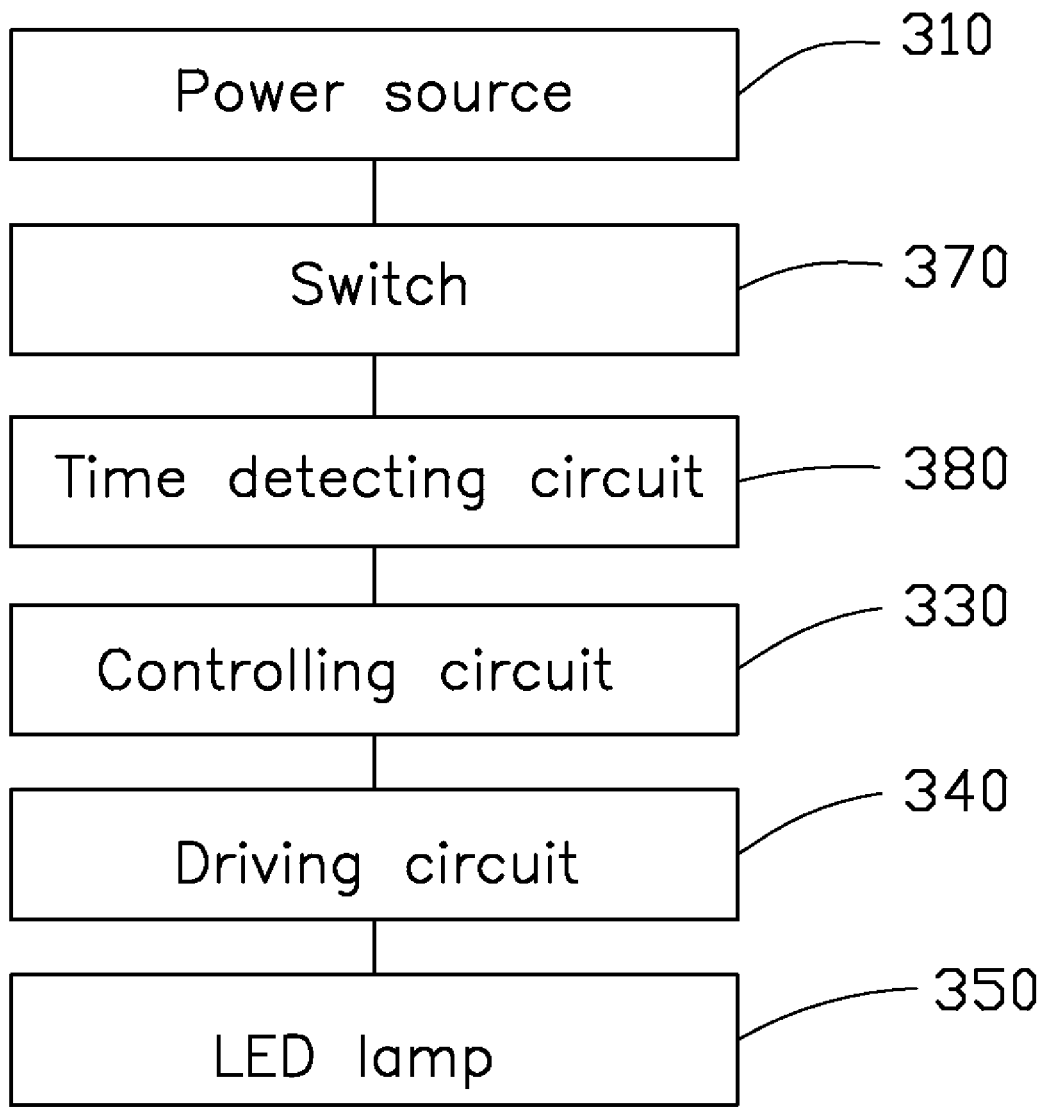
FIG. 17 is a block diagram of another power supply circuit connected to the LED lamp.

Referring to FIG. 17, a time detecting circuit 380 is electrically connected between the controlling circuit 330 and a basic switch 370 which only has two states, i.e., an "on" state and an "off" state. The time detecting circuit 380 can measure switching times and switching periods of the switch 370, thereby providing corresponding signals into the controlling circuit 330 to lighten the LED lamp 350 at different brightness. For example, when the time detecting circuit 380 detects the switch 370 just switched once from the "off" state to the "on" state, it will produce a signal into the controlling circuit 330 to lighten the LED lamp 350 with 100% brightness; when the time detecting circuit 380 detects the switch 370 switched continuously twice from the original "off" state to the "on" state, it will produce another signal to the controlling circuit 330 to lighten the LED lamp 350 with 80% brightness; when the time detecting circuit 380 detects the switch 370 switched continuously thrice to the "on" state, it will produce still another signal to the controlling circuit 330 to lighten the LED lamp 350 with 60% brightness, and the rest may be deduced by analogy. That is to say, the time detecting circuit 380 works under a calculation mode to decrease the brightness of the LED lamp 350 with constant 20% original brightness by each reconnection of the switch 370. It is noted that a period between a "switch off" action and a next "switch on" action of the switch 370 should be less than a critical period (preferably with a value of 5 seconds), or else the next "switch off" action would be recognized by the time detecting circuit 380 as a resetting signal to reset the LED lamp 350 with 100% brightness. Alternatively, the time detecting circuit 380 can also be designed to produce opposite signals sequentially, whereby the brightness of the LED lamp 350 would gradually increase according to accumulation of the switching times of the switch 370. Due to application of the time detecting circuit 380 and the controlling circuit 330, only the basic switch 370 is required to realize the brightness-controllable function of the LED lamp 350, and the electrical routes of the switch 370 are thus simplified without so many electrical pathways as the conventional multiplex switch requires.

In addition, for a more flexible adjusting capability, another calculation mode can be applied to the time detecting circuit 380. Only when the time detecting circuit 380 detects the period between two adjacent actions of the switch 370 within a rated value (such as 3 seconds), the next action of the switch 370 would be admitted as a continuous one from a previous action of the switch 370; otherwise, the next action to the switch 370 would be recognized as a beginning of a new turn when the period is more than 3 seconds and less than 5 seconds. In this mode, the new turn would base on the final result of the previous turn to calculate the brightness level of LED lamp achievable by the new turn, rather than decrease the brightness with the constant 20% from the previous value as the previous calculation mode does. For example, based on that the brightness of the LED lamp 350 is originally set to 100%, if the switch 370 has been switched twice properly to reduce the brightness to 60%, a next "switch off" action (i.e., from "on" to "off" of the switch 370 which lasts for more than the rated period (3 seconds) and less than the critical period (5 seconds) would be recognized as a beginning of a new turn. As the switch 370 is further switched on (from "off" to "on") once within the rated period, the brightness of 60% would be reduced with 20% thereof to 48%. In other words, the new turn will base on the previous value, i.e., 60% to calculate its brightness level. Like to the previous mode, a critical period (preferably with a value of 5 seconds) should also be introduced in this mode for conveniently resetting the LED lamp 350. However, for the switch action from "off" to "on" which lasts for a period between the critical period and the rated period, such an switch action does not have any influence on the brightness level of the LED lamp; that is to say, this action would not be calculated but ignored by the time detecting circuit 380. Assuming that the primary brightness of the LED lamp 350 is 100%, and the critical period and the rated period are 5 seconds and 3 seconds, respectively, some samples of the LED lamp 350 in this mode are listed below for illustration:

| Switch action | | | | | | | | | Obtained LED lamp brightness |
|---|---|---|---|---|---|---|---|---|---|
| off | 2 s | On | 2 s | Off | 2 s | on | | | 60% |
| off | 2 s | On | 2 s | Off | | 4 s | on | | 80% |
| off | 2 s | On | | 4 s | Off | 2 s | on | | 64% |
| off | 2 s | On | 2 s | Off | | 6 s | | On | 100% |

The time (such as 2 s, 4 s and 6 s) between two adjacent actions is the period that the switch 370 has spent from the pervious action (position) to the next action (position). Since the brightness is decreased in percent in this mode, nearly unlimited illumination levels of the LED lamp 350 can be achieved. On the other hand, for facilitating a user to judge the rated period more easily, an LED indicator (not shown), which is connected with the time detecting circuit 380 can be provided on the LED lamp. As soon as the switch 370 is switched, the LED indicator would start to flick to show the rated period of 3 seconds, reminding the user to make the next action timely.

Figure 18:
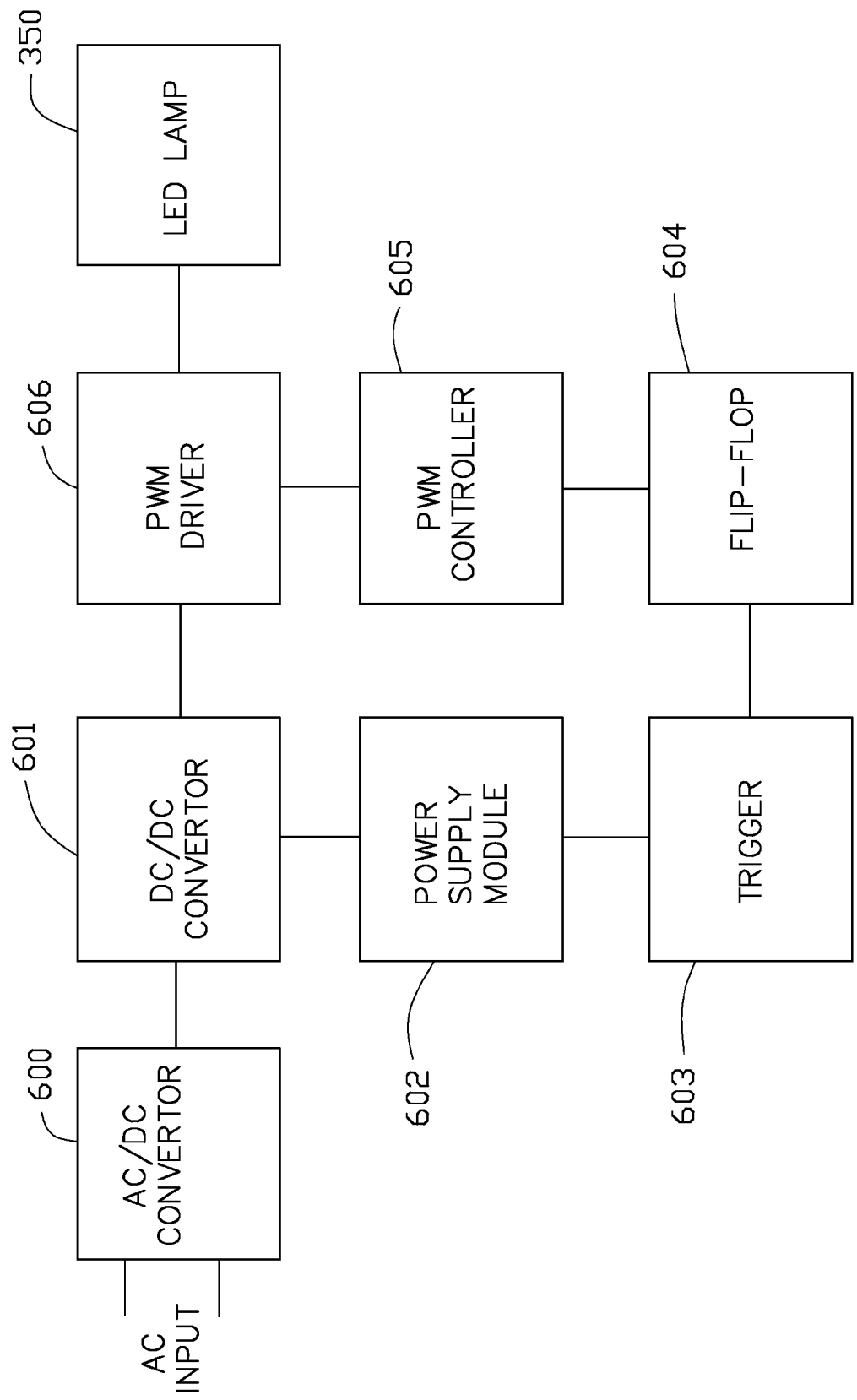
FIG. 18 is a block diagram showing detailed electrical elements used in FIG. 17.

FIG. 18 shows detailed electrical elements included in the electrical circuits of FIG. 17. An AC/DC convertor 600 (AC being alternating current and DC being direct current) is connected between an AC power source (not shown) and a DC/DC convertor 601 for converting an AC from the AC power source to a DC to the DC/DC convertor 601. The DC/DC convertor 601 diverges to two electrical pathways, wherein a first electrical pathway is directly connected to a PWM (Pulse-Width Modulation) driver 606, and a second electrical pathway is connected to the PWM driver 606 sequentially through a power supply module 602, a trigger 603, a flip-flop 604 and a PWM controller 605. The first electrical pathway takes charge to supply the current into the LED lamp 350 via the PWM driver 606, while the second electrical pathway takes charge to supply the current into the flip-flop 604 and the PWM controller 605 to energize them. Since the flip-flop 604 and the PWM controller 605 do not need too large current, the power supply module 602 is applied to the second electrical pathway to adjust the current with a suitable value. The flip-flop 604 is for producing two different leveled currents into the PWM controller 605 in accordance with the two different switching states (on and off) of the trigger 603. The PWM controller 605 then calculates the switching times and switching periods according to the leveled currents and controls the PWM driver 606 to deliver a corresponding current to the LED lamp 350. The AC power source, the AC/DC convertor 600, the DC/DC convertor 601 and the power supply module 602 together present the power source 310 of FIG. 17, the trigger 603 and the flip-flop 604 cooperatively present the switch 370 of FIG. 17, the PWM controller 605 simultaneously functions as the time-detecting circuit 380 and the controlling circuit 330 of FIG. 17, and the PWM driver 606 presents the driving circuit 340 of FIG. 17.

Figure 19:
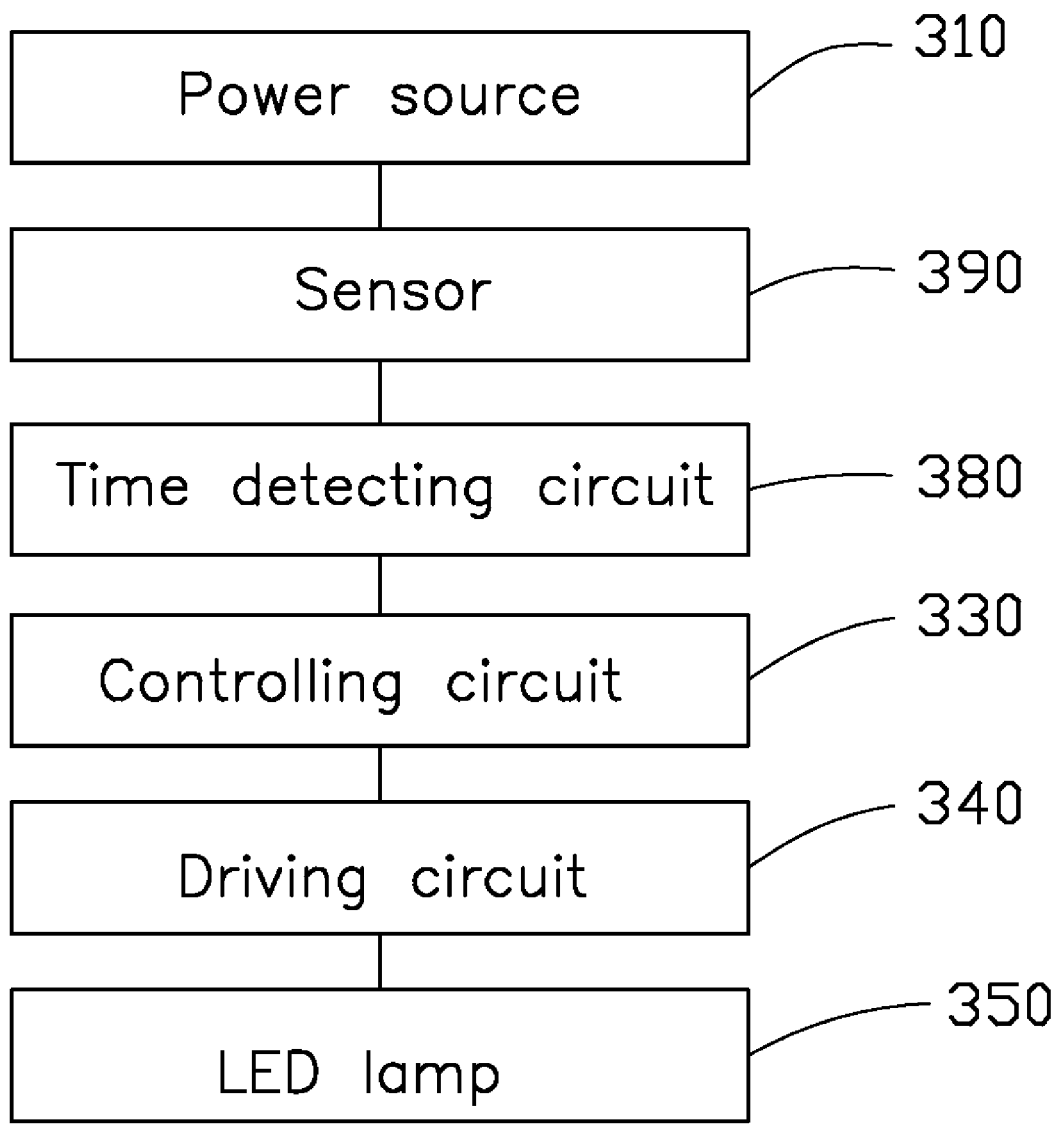
FIG. 19 is similar to FIG. 17, but a switch of the power supply circuit being replaced by a sensor.

Furthermore, such basic switch 370 can be replaced with other "special switches", such as acoustical switch or touch switch, depending on the actual requirement, As shown in FIG. 19, if an acoustical sensor 390 is connected to the time detecting circuit 380, the previous LED lamp 350 will become a sound-controllable LED lamp 350 where the manual manipulation of the basic switch 370 is substituted by a sound. A critical value of the sound that the sensor 390 can recognize is preferably set about 60 db, above which the sensor 390 could generate a signal to the time detecting circuit 380, or else no signal would be produced by the sensor 390. Furthermore, for preventing an interference of cacophony unexceptedly, a more advanced sensor 390 called "voice sensor", can be applied to the LED lamp 350. The voice sensor 390 generates a signal only when an exact word or term which is recognizable by the sensor 390, being spoken by a user. The word or term can be set by the user voluntarily, such as "hello", "switch on", or else. The touch switch 370 can be realized by coupling a thermistor sensor 390 or light sensor 390 with the time detecting circuit 380. The thermistor sensor 390 would be activated to produce signals if a predetermined quantity of heat (such as the amount of heat generated by a finger of a person) is detected thereby. The light sensor 390 is activated that only a variation of surrounding light (such as light generated by an LED indicator is blocked by a finger) is detected thereby. The replacement of the basic switch 370 with the various sensors 390, i.e., the sound sensor, the voice sensor, the thermistor sensor or the light sensor, can further render the whole mechanical structure of the switch 370 more compact.

It is believed that the present disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

The invention claimed is:

1. An illumination system comprising:
   an LED lamp;
   a power source;
   a timer;
   a humidity sensor;
   a controlling circuit; and
   a driving circuit;
   wherein the power source, the timer, the controlling circuit and the driving circuit are electrically connected to the LED lamp, and wherein the timer produces different signals to the controlling circuit at different times to thereby drive the LED lamp to illuminate a road with different brightness;
   wherein the LED lamp comprises two type LEDs which respectively emit cold light and warm light, the LED lamp selectively producing only one of the warm and cold light each time;
   wherein the humidity sensor is electrically connected to the LED lamp for switching the LED lamp between the warm light and the cold light via the controlling circuit in response to a humidity of environment; and
   wherein the humidity sensor drives the LED lamp to emit the warm light when rain or fog in the environment is detected by the humidity sensor, and drives the LED lamp to emit the cold light when other weather conditions are detected by the humidity sensor.

2. The illumination system as claimed in claim 1, wherein when a traffic flow on the road is high at night, the timer produces a first signal to drive the LED lamp to illuminate with full brightness, and wherein when the traffic flow on the road is low at night, the timer produces a second signal to drive the LED lamp to illuminate with a reduced brightness, and wherein at daytime the timer produces a third signal to turn off the LED lamp.

3. The illumination system as claimed in claim 2, wherein the timer produces the first signal at 18:00~24:00 to drive the LED lamp to illuminate with 100% brightness.

4. The illumination system as claimed in claim 3, wherein the timer produces the second signal at 24:00~6:00 to drive the LED lamp to illuminate with 50% brightness.

5. The illumination system as claimed in claim 3, wherein the timer produces the second signal at 3:00~6:00 to drive the LED lamp to illuminate with 50% brightness.

6. The illumination system as claimed in claim 5, wherein the timer further produce a forth signal at 24:00~3:00 to drive the LED lamp to illuminate with 80% brightness.

7. The illumination system as claimed in claim 2 further comprising a sensor electrically connected to the LED lamp, wherein the sensor could detect light or movement of an object on the road to produce a fifth signal to the controlling circuit, the LED lamp is activated to lighten for a period in response to the fifth signal.

8. The illumination system as claimed in claim 7, wherein the first, second and third signals are continuous, and the fifth signal is temporary.

9. The illumination system as claimed in claim 8, wherein the controlling circuit only accepts the first and second signals in the period when the fifth signal is simultaneously input thereto and rejects the first and second signals at other times, and the controlling circuit always accepts the third signal and rejects the fifth signal when they are produced at the same time.

10. The illumination system as claimed in claim 7, wherein the period is 10 seconds.

11. The illumination system as claimed in claim 1 further comprising a temperature sensor electrically connected to the LED lamp, wherein the temperature sensor can further switch the LED lamp between the warm and cold light in response to a temperature of environment.

12. The illumination system as claimed in claim 11, wherein the LED lamp always produces the warm light at rainy or fogged day regardless of the temperature.

13. The illumination system as claimed in claim 12, wherein the LED lamp produces the warm light at other weathers when the temperature is below 15° C.

14. The illumination system as claimed in claim 13, wherein the LED lamp produces the cold light at other weathers when the temperature is no less than 15° C.

15. An illumination system comprising:
   an LED lamp;
   a power source;
   a sensor;
   a timer;
   a controlling circuit; and
   a driving circuit;
   wherein the power source, the timer, the controlling circuit and the driving circuit are electrically connected to the LED lamp, and wherein the timer produces different signals to the controlling circuit at different times to thereby drive the LED lamp to illuminate a road with different brightness;
   wherein when a traffic flow on the road is high at night, the timer produces a first signal to drive the LED lamp to illuminate with full brightness, and wherein when the traffic flow on the road is low at night, the timer produces a second signal to drive the LED lamp to illuminate with a reduced brightness, and wherein at daytime the timer produces a third signal to turn off the LED lamp;
   wherein the sensor is electrically connected to the LED lamp, and wherein the sensor could detect light or movement of an object on the road to produce a fifth signal to the controlling circuit, the LED lamp is activated to lighten for a period in response to the fifth signal;

wherein the first, second and third signals are continuous, and the fifth signal is temporary; and wherein the controlling circuit only accepts the first and second signals in the period when the fifth signal is simultaneously input thereto and rejects the first and second signals at other times, and the controlling circuit always accepts the third signal and rejects the fifth signal when they are produced at the same time.

* * * * *